(12) United States Patent
Okura

(10) Patent No.: US 9,373,767 B2
(45) Date of Patent: Jun. 21, 2016

(54) LIGHT EMITTING DEVICE WITH LIGHT REFLECTING MEMBER HAVING PROTRUSION OVER BONDING BALL OF WIRE

(71) Applicant: NICHIA CORPORATION, Anan-shi, Tokushima (JP)

(72) Inventor: Shinya Okura, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 4 days.

(21) Appl. No.: 14/492,513

(22) Filed: Sep. 22, 2014

(65) Prior Publication Data

US 2015/0092414 A1    Apr. 2, 2015

(30) Foreign Application Priority Data

Sep. 30, 2013 (JP) ................. 2013-203704

(51) Int. Cl.
| | |
|---|---|
| *F21V 13/02* | (2006.01) |
| *F21V 7/22* | (2006.01) |
| *H01L 33/60* | (2010.01) |
| *H01L 25/075* | (2006.01) |
| *H01L 33/50* | (2010.01) |
| *H01L 33/62* | (2010.01) |
| *H01L 33/56* | (2010.01) |

(52) U.S. Cl.
CPC .............. *H01L 33/60* (2013.01); *H01L 25/0753* (2013.01); *H01L 33/508* (2013.01); *H01L 33/56* (2013.01); *H01L 33/62* (2013.01); *H01L 2224/45144* (2013.01); *H01L 2224/48091* (2013.01); *H01L 2224/48137* (2013.01); *H01L 2224/48465* (2013.01); *H01L 2224/48471* (2013.01); *H01L 2224/4945* (2013.01); *H01L 2224/73265* (2013.01); *H01L 2224/8592* (2013.01); *H01L 2924/181* (2013.01)

(58) Field of Classification Search
CPC ........... H01L 2224/48091; H01L 2224/48465; H01L 2924/00014; H01L 2224/48471; H01L 2224/4945; H01L 2224/8592; H01L 25/0753; H01L 33/60; H01L 33/62
USPC ........................................................ 362/260
See application file for complete search history.

(56) References Cited

U.S. PATENT DOCUMENTS

| | | | | |
|---|---|---|---|---|
| 5,328,079 A | * | 7/1994 | Mathew | .................. H01L 24/48 228/180.5 |
| 2002/0079354 A1 | * | 6/2002 | Lee | ...................... B23K 20/004 228/180.5 |
| 2009/0073715 A1 | | 3/2009 | Saito et al. | |
| 2010/0193822 A1 | | 8/2010 | Inobe et al. | |
| 2013/0169149 A1 | | 7/2013 | Sato et al. | |
| 2013/0183787 A1 | | 7/2013 | Inobe et al. | |
| 2015/0171282 A1 | * | 6/2015 | Wakaki | .................. H01L 33/62 257/99 |
| 2015/0187838 A1 | * | 7/2015 | Kawano | .................. H01L 27/15 257/88 |

FOREIGN PATENT DOCUMENTS

| | | |
|---|---|---|
| JP | 11-284234 A | 10/1999 |
| JP | 2002-043625 A | 2/2002 |

(Continued)

*Primary Examiner* — Joseph L Williams
(74) *Attorney, Agent, or Firm* — Global IP Counselors, LLP

(57) ABSTRACT

A light emitting device of the invention includes a substrate having a metal on a surface thereof; a light emitting element installed on the surface of the substrate; a wire that connects the light emitting element and the metal; and a light reflecting member that covers the metal, the wire having a first bonding ball that is disposed on a surface of the metal, and an extension that extends above the first bonding ball, and the light reflecting member having a protrusion over the first bonding ball.

12 Claims, 2 Drawing Sheets

(56) References Cited

FOREIGN PATENT DOCUMENTS

| | | |
|---|---|---|
| JP | 2005-136378 A | 5/2005 |
| JP | 2006-314082 A | 11/2006 |
| JP | 2009-295892 A | 12/2009 |
| JP | 2010-199547 A | 9/2010 |
| JP | 2010-232203 A | 10/2010 |
| JP | 2010-283281 A | 12/2010 |
| JP | 2012-089539 A | 5/2012 |
| JP | 2012-109404 A | 6/2012 |
| JP | 2012-199378 A | 10/2012 |
| WO | 2012-029695 A1 | 3/2012 |

* cited by examiner

LIGHT EMITTING DEVICE WITH LIGHT REFLECTING MEMBER HAVING PROTRUSION OVER BONDING BALL OF WIRE

CROSS-REFERENCE TO RELATED APPLICATION

This application claims priority to Japanese Patent Application No. 2013-203704, filed on Sep. 30, 2013. The entire disclosure of Japanese Patent Application No. 2013-203704 is hereby incorporated herein by reference.

BACKGROUND OF THE INVENTION

1. Field of the Invention

The present invention relates to a light emitting device, and more particularly relates to a light emitting device in which a light reflecting member is disposed around a light emitting element.

2. Description of the Related Art

A light emitting device has been proposed in the past in which a light scattering layer is disposed around a light emitting element that is compact and has good power efficiency, in order to efficiently utilize the light emitted from the end face of the light emitting element and thereby improve emission efficiency (JPH11-284234A, and JP2010-232203A).

SUMMARY OF THE INVENTION

Even when a light scattering layer is provided, depending on the type of metal member disposed on the substrate surface where the light emitting element is installed, the light emitted from the light emitting element can be absorbed, so at present the need for initial brightness in particular cannot be sufficiently satisfied.

The present invention was conceived in an effort to solve this problem, and it is an object thereof to provide a light emitting device which light can be extracted more efficiently. The inventors conductive various studies into the use of the light scattering layer used in the past in order to prevent the absorption of light by the metal disposed on the substrate surface where the light emitting element is installed, and as a result they discovered that the absorption of light by the metal can be prevented by increasing the reflectivity of the light scattering layer and covering the metal with this highly reflective light scattering layer. At the same time, they conducted a variety of experiments with various permutations regarding how the light emitting element was mounted (such as face-up or face-down), the thickness of the light emitting element, the material and viscosity of the light scattering layer, and the shape of the light scattering layer, and through this discovered that light extraction efficiency can be reliably improved by disposing a light scattering layer with high reflectivity in a suitable location and a favorable state. This resulted in the perfection of the present invention.

The present disclosure provides a light emitting device. The light emitting device of the invention includes a substrate having a metal on a surface thereof; a light emitting element installed on the surface of the substrate; a wire that connects the light emitting element and the metal; and a light reflecting member that covers the metal, the wire having a first bonding ball that is disposed on a surface of the metal, and an extension that extends above the first bonding ball, and the light reflecting member having a protrusion over the first bonding ball.

According to this disclosure, it is possible to provide the light emitting device of the disclosure which light can be extracted more efficiently with simple configuration.

DETAILED DESCRIPTION OF THE INVENTION

Figure 1A:
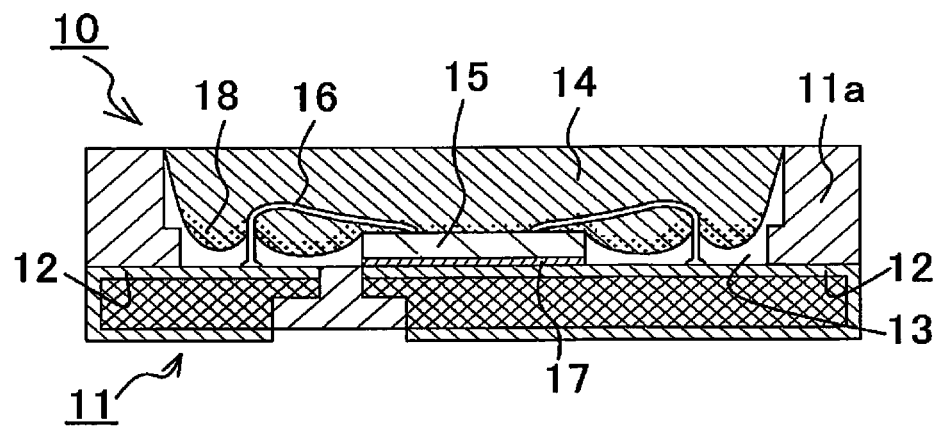
FIG. 1A is a simplified cross section of the main components of an embodiment of the light emitting device of the present invention.

Embodiments for implementing the light emitting device of the present disclosure will be described below with reference to the accompanying drawings. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. In addition, a plurality of structural elements of the present invention may be configured as a single part which serves the purpose of a plurality of elements, on the other hand, a single structural element may be configured as a plurality of parts which serve the purpose of a single element. Further, constitutions described in some of examples and embodiments can be employed in other examples and embodiments.

The light emitting device of the present invention comprises a substrate, a light emitting element, a wire and a light reflecting member. The light emitting device can further comprises a translucent member.

Substrate

A light emitting device usually comprises a substrate for installing a light emitting element.

The substrate is usually formed of the insulating materials such as a glass-epoxy resin (glass fibre reinforced epoxy resin), a resin, a ceramic (HTCC: High Temperature Co-fired Ceramics, LTCC: Low Temperature Co-fired Ceramics), or a composite material of the insulating material and a metal member. A ceramic with high thermostability and weatherability is preferably used for the substrate material. Examples of the ceramic include alumina, aluminum nitride, mullite and the like. An insulating material such as a bismaleimide-triazine resin, a glass-epoxy resin, an epoxy-based resin can combine with the ceramic material.

The substrate used here is usually one that has a metal wiring pattern connected to the light emitting element on its surface and/or in its interior. The wiring pattern can be formed of a metal such as Cu, Al, Au, Ag, W, Fe and Ni, or an alloy such as Fe—Ni alloy, phosphor bronze. If the metal is disposed on the surface, that surface can be given a reflective plating so that light from the light emitting element installed on the substrate can be extracted more efficiently. The metal can be curved or distorted on the substrate surface or interior. The thickness of the metal is from a few microns to a few hundred microns, for example.

A substrate such as this is known in this field, and any substrate that is used for the mounting of light emitting elements and the like can be used.

In addition to being electrically connected to the light emitting element, the metal can also be used to impart other functions, such as installing a light emitting element or a protective element, improving heat dissipation, or electrically connecting to a protective element.

Also, if the metal on the surface of the substrate is in the form of a wiring pattern, it can also be called a metal film, but the present invention is not limited to this, and also encompasses a lead frame type of light emitting device. That is, if a substrate composed of a lead and resin is used as the substrate on which the light emitting element is installed, that lead will be exposed on the surface of the substrate, and the lead corresponds to the metal on the surface of the substrate.

It is especially preferable for the substrate to have a wall that surrounds the light emitting element. In other words, the substrate can have a recess in its surface for installing the light emitting element, or a wall can be provided to the flat substrate so as to be opposite (or face) the light emitting element. If the substrate has a wall, the light emitted from the light emitting element can be distributed better. The side of the wall opposite the light emitting element can be normal to the surface of the substrate, or can be stepped (see the wall 11a in FIG. 1A), or can be curved, or can be inclined. Using a shape such as these allows light to be efficiently extracted in the desired direction. In particular, the surface area can be increased if the shape is stepped, and this prevents the separation of the light reflecting member (discussed below), and also promotes higher creep-up of the light reflecting member. The height of the wall can be suitably adjusted according to the size of the light emitting element, the size of the light emitting device, and so forth.

The surface of the wall is preferably reflective of the light emitted from the light emitting element, as discussed below.

Light Emitting Element

The light emitting element used in this disclosure means an element so-called light emitting diode. Examples thereof include a laminated structure that is formed on a substrate and has an active layer formed from various semiconductor such as a nitride semiconductor such as InN, AlN, GaN, InGaN, AlGaN, InGaAlN, a III-V compound semiconductor, a II-VI compound semiconductor. The substrate may be ultimately removed from the laminated structure of the light emitting element.

The light emitting element can be one in which positive and negative electrodes are formed on opposite faces, but the positive and negative electrodes are preferably formed on the same side. The pair of electrodes in the latter case can be disposed at the same height, or there can be a height difference between the electrodes. There need not be one each of the positive and negative electrodes, and two or more of each can be formed.

There are no particular restrictions on the material, thickness, or structure of the electrodes, and they can be either a single-layer structure or laminated structure of a metal such as Au, Cu, Pb, Al or an alloy thereof. Further, pad electrodes can be formed of either a single-layer structure or laminated structure of a metal such as Ni, Ti, Au, Pt, Pd, W or an alloy thereof on surfaces of the electrodes. There are no particular restrictions on the film thickness of the pad electrode, but it is preferable if gold is disposed at the last layer (the one closest to the surface), and if the thickness of the film is about 100 nm or more.

The light emitting element is usually installed on the upper face of the above-mentioned substrate, and fixed by a joining member.

When the light emitting element has positive and negative electrodes on opposite faces, the light emitting element is installed on the metal of the substrate, and the face on which one of the electrodes (hereinafter may also be referred to as the first electrode) is formed (hereinafter may also be referred to as the first face or rear face) is preferably fixed by a joining member including a conductive paste containing Ag, Au, Pd, or the like. This allows the first electrode disposed on the rear face to be electrically connected to the metal of the substrate by the conductive paste.

The other face on which the other electrode (hereinafter may also be referred to as the second electrode) is formed (hereinafter may also be referred to as the second face or upper face) is disposed on the opposite side from the substrate, and the second electrode is electrically connected to a wire as discussed below. The wire connected to the second electrode is also electrically connected to the metal of the substrate. In this case, the second electrode and the metal can be connected by the wire at just one place, but are preferably connected at two or more places. If there are wire connections at two or more places, the light reflecting member (discussed below) can be disposed more stably and in the proper place and the proper shape.

When the light emitting element is used that has positive and negative electrodes on the same side, the mounting is preferably face-up. That is, the face on the side where the electrodes are not formed (hereinafter may also be referred to as the first face or rear face) is preferably fixed to the substrate with an epoxy resin, silicone, or another such joining member. Also, since heat or light from the light emitting element can result in degradation, the rear face of the light emitting element can be metal plated with Al, Ag, or the like, and eutectic Au—Sn or another such solder, a braze made of a low-melting point metal or the like, a conductive paste, or another such joining member can be used. These electrodes, as discussed below, are electrically connected by wires. In this case, these electrodes are preferably electrically connected to the metal of the substrate by wires, respectively.

Because of this, with the light emitting device of the present invention, just one light emitting element can be installed in one light emitting device, or a plurality of elements can be installed. If a plurality of light emitting elements are installed, there are no particular restrictions on how they are arranged, and they can be in parallel, in series, or in a combination of these, for example.

Wires

As discussed above, the wires are conductive members that electrically connect the light emitting element to the metal of the substrate. The wires are electrically connected to the electrodes formed on the surface of the light emitting element. Therefore, the wires preferably have good ohmic properties with the electrodes of the light emitting element, or good mechanical connectability, or good electrical and thermal conductivity. The thermal conductivity is preferably at least about 0.01 cal/S·cm2·° C./cm, and more preferably at least about 0.5 cal/S·cm2·° C./cm. When ease of work and so forth are taken into account, the wire diameter is preferably about 1 to 45 μm. Examples of the wire material include Au, Cu, Pt, Al, Ag, and other such metals, as well as alloys of these. Au is especially preferable from the standpoints of joint reliability, stress release after joining, and so forth.

The wires preferably have a first bonding ball (also known as an initial ball) disposed on the surface of the metal. In other words, the wires are preferably such that the first bond is disposed on the metal, rather than on the light emitting element.

The term "first bond" here means the place where joining begins in the wire connection between points, and can also be called the place having the first bonding ball. Also, the "second bond" (discussed below) means the place where joining ends in the wire connection between points.

The first bonding ball can be formed by a known bonding method, such as ball bonding. For example, the wire is passed through a capillary or other such jig, and high-temperature heat produced by spark or the like is utilized to apply heat and, if desired, a load and/or ultrasonic waves to the tip of the wire, thereby producing a ball by melting the wire. There are no particular restrictions on the temperature here, which can be adjusted according to the material, thickness, and so forth of the wire being used. An example is a temperature of about 360° C. or lower. There are no particular restrictions on the size of the ball, but it is usually about 1.2 to 20 times the diameter of the wire, and preferably about 1.5 to 10 times. After this, the ball is joined on the metal.

Consequently, the bonding balls can serve as pad electrodes, even if the electrodes are thin films on the substrate, which reduce or mitigate the damage caused by pressure and the like exerted on the areas where the wire bonds are formed. This allows for more stable joining.

The first bonding ball is preferably a crimped ball. This form makes it easier to adjust the height and joint surface area, and also ensures good joint strength of the wire bonding itself. During joining, the ball can be crimped while being subjected to ultrasonic waves.

The height of the first bonding ball can be adjusted by suitably setting the diameter of the wire, the amount of wire to be fed (usually the length of wire played out from the jig), the joining temperature to which the tip of the wire is subjected, the load on the ball during crimping, and other such conditions. For example, the height of the first bonding ball is preferably about one to three times the diameter of the wire. More specifically, about 10 to 30 μm is preferable, and about 15 to 20 μm is more preferable.

The joint surface area of the first bonding ball with the metal can be suitably adjusted according to the form of the light reflecting member (discussed below). For example, it is about one to three times the diameter of the wire, or about one-third to one time the diameter of the ball.

As discussed above, the location of the first bonding ball is the surface of the metal, and can be a position that allows the wires to make a good electrical connection between the light emitting element and the metal. Usually, this depends on the size of the light emitting element and the size of the intended light emitting device, but the distance from the light emitting element, for example, is preferably within a range of about 400 to 600 μm.

From another standpoint, when the substrate has the wall that surrounds the light emitting element, the first bonding ball is preferably disposed in an intermediate region between the light emitting element and the wall. The term "intermediate region" here means a region including a center between the light emitting element and the wall, the center allows a plus-minus 15% shift in distance between the light emitting element and the wall.

Within this range, in normal wire bonding, the wire itself will not come into contact with other parts of the light emitting device, such as the upper edge of the light emitting element, so this prevents wire damage. It also reliably prevents the light reflecting member (discussed below) from becoming an extremely thin film.

The first bonding ball can be formed by the following method, for example.

First, a ball formed by melting a wire is crimped onto the metal, and a capillary is moved horizontally in any direction, either after being moved slightly upward or not being moved. The "any direction" here can be, for example, a range of about 150 to 210°, if we let a specific part of the light emitting element to be connected be the 0° position. That is, this is approximately the opposite direction from the light emitting element to be connected. The distance in which the capillary is moved here is favorably about 10 to 100 μm. After this, the capillary is raised. The capillary is then moved horizontally right over the first bonding ball, after which it is lowered to crimp the capillary on the first bonding ball, and another part of the wire extending from the first bonding ball is crimped on the first bonding ball. When the other part of the wire is crimped on the first bonding ball, this crimping can be performed while applying ultrasonic waves, but the crimping is preferably performed without this application. Thus, performing the crimping twice allows the first bonding ball surface to be made substantially flat, and allows the height of the first bonding ball and the contact surface area with the metal to be adjusted more reliably.

The wire preferably has an extension that extends above the first bonding ball. The wire usually also has a part in which the direction changes from the extension toward the second bond, and a part that extends to the second bond. The second bond is preferably disposed on the light emitting element. As a result, the wire connects the metal and the light emitting element.

The extension that extends at above the first bonding ball preferably has a part that is above the first bonding ball and extends inside the outer edge of the first bonding ball, and it is particularly preferable for it to have a part that extends in the vertical direction with respect to the surface of the metal. The extension is preferably a part that extends from the first bonding ball. The "vertical direction" here means any direction that is within plus-minus 5° or about plus-minus 3° of vertical, and preferably allows inclination to the light emitting element side. The extension can have a length equal to, less than, or greater than the height from the first bonding ball to the upper face of the light emitting element. For example, the length is preferably about plus-minus 20% of a length equivalent to the height from the first bonding ball to the upper face of the light emitting element. The extension of the wire can be used to advantage in adjusting the height of the protrusion of the light reflecting member (discussed below).

The part where the direction changes from the extension of the wire toward the second bond may not have a distinct boundary with the extension that extends from above the first bonding ball. Usually, the direction that changes refers to a direction toward a specific electrode on the upper face of the light emitting element. The change in direction can be either gradual or sudden.

The part that extends to the second bond is located at least above the light emitting element and its surroundings (that is, on the metal). This part extends to the second bond with the wire slightly inclined or at substantially the same height. The inclination here can be within about 10 degrees, for example, is preferably within about 7 degrees, and is more preferably within about 5 degrees. This part at the second bond preferably has a shape that is pressed on by the wire, that is, a bonding stitch shape.

This series of wires is preferably such that the highest part is located between the light emitting element and the first bonding ball, and above the metal where the light emitting element is not installed. Employing this loop shape allows the extension of the wire to be reliably disposed in a direction perpendicular to the surface of the metal. It also allows the total thickness (height) of the light emitting device itself to be further reduced. Furthermore, it prevents contact with other parts of the wire, and prevents wire discontinuity, etc.

A known bonding method, such as ball bonding, can be used to achieve this wire configuration, for example. The use of a ball stitch on ball (BSOB) method is particularly favorable.

First, as discussed above, the first bonding ball is formed by wire on the metal. As the wire is played out, the capillary is raised up from the first bonding ball. After this, the capillary is moved horizontally in the opposite direction from the electrode to be connected to the light emitting element. The capillary is then raised, after which it is lowered while being moved toward the electrode to be connected to the light emitting element, and the wire is preferably pressed against the electrode surface of the light emitting element. Here, a bonding stitch can be formed as a so-called second bond on the electrode of the light emitting element by deforming the wire with heat, load, and/or ultrasonic waves. The order and extent of the horizontal movement, raising, and lowering of the capillary can be suitably modified according to the intended wire loop shape.

As discussed above, this wire configuration can be present at one or more wire bonding points in a single light emitting device. That is, one or more of the first bonding balls can be formed in a single light emitting device. Usually, two are formed in a light emitting device equipped with one light emitting element that is mounted face-up. In this case, they are preferably disposed apart from each other, such as at opposite corners, in the light emitting device. With a light emitting device equipped with two or more light emitting elements that are mounted face-up, two or more can be formed according to the connection configuration of the light emitting element. Here again, they are preferably disposed apart from each other, such as at opposite corners, in the light emitting device.

However, a bonding ball that is the same as the first bonding ball but has no electrical connection can be further disposed on the surface of the metal, in addition to the first bonding ball that is used to electrically connect the light emitting element and the metal. This affords a more favorable disposition in the proper location of the light reflecting member (discussed below). That is, the extremely thin film portion of the light reflecting member can be eliminated.

Light Reflecting Member

Part of the surface of the metal is covered by a light reflecting member, and preferably all of the surface of the metal is covered. This prevents the light emitted from the light emitting element from being absorbed by the metal. As a result, initial brightness can also be increased.

The light reflecting member has a protrusion. The protrusion is formed by utilizing the upward creep of the material constituting the light reflecting member with respect to the first bonding ball, and covers at least all or part of the surface of the first bonding ball. The protrusion is preferably further disposed on the first bonding ball, and is preferably disposed to over the first bonding ball. In other words, the light reflecting member preferably has a protrusion that covers the whole surface of the metal other than the part of the first bonding ball that is joined to the metal and/or that covers the whole exposed surface of the first bonding ball. The light reflecting member more preferably has a protrusion that covers the whole exposed surface of the first bonding ball and that extends to over the first bonding ball. The protrusion preferably is disposed covering part of the extension that extends upward from the first bonding ball.

Therefore, the height of the light reflecting member gradually changes toward the protrusion, that is, it gradually gets taller. The "protrusion" here refers not only to a part where the thickness of the light reflecting member increases into a protrusion, but also to a part that protrudes as a result of a member or film (i.e., the first bonding ball) disposed at a lower layer, for example, with respect to the surface of the light reflecting member disposed at the lowest position (that is, the position closest to the substrate surface). Therefore, this may not be the thickest part of the light reflecting member.

The protrusion affords reliably coverage of the metal surface of the light reflecting member, and also effectively prevents the light emitting element upper face of the light reflecting member from being covered. Thus, the light extraction efficiency can be improved, and the need for initial brightness can also be satisfied.

That is, the light reflecting member is usually formed from a molten resin or a resin solution (hereinafter may be referred to as a "resin solution, etc.") as discussed below, but when the metal surface is covered, this resin solution, etc., has considerable flow and/or wetting properties. Therefore, with a flat surface, it will spread out over the surface under surface tension.

Meanwhile, when there are bumps on the side faces of the light emitting element, the walls of the above-mentioned recess in the substrate, or the like on a flat surface, the resin solution, etc., will creep up along these bumps.

Since modern light emitting devices are extremely small, the amount of resin solution, etc., that is used for the light reflecting member is minute, making fine adjustments very difficult.

Accordingly, when the resin solution, etc., creeps up along the bumps, since the amount of resin solution, etc., is extremely small, the resin solution, etc., that is supposed to be on the surface of the metal everywhere except near the bumps will be attracted to the bumps and concentrate there, can which lead to an extremely thin film in other regions, or to a film in the form of islands, so that part of the metal is exposed. As a result, light emitted from the light emitting element will be absorbed by the metal at the exposed portions or the portions where the light reflecting member has become extremely thin, and this lowers the light extraction efficiency.

In particular, the resin solution, etc., will be more prone to creeping up along the side faces of the light emitting element if the light emitting element itself is thin, and can even reach the upper face of the light emitting element. Also, as discussed in JP H11-284234A, for example, when the wire is inclined at an acute angle to the surface of the metal, the resin solution, etc., can move along the wire and eventually reach the light emitting element upper face. As a result, the light emission region is constricted, and the light extraction efficiency ends up being lowered.

In contrast, when the wire composed of the first bonding ball and the extension that extends above it is actively disposed on the metal as discussed above, the resin solution, etc., that would otherwise creep up to unintended parts can be actively made to creep up to the first bonding ball. Therefore, the resin solution, etc., can be reliably prevented from creeping up to unintended parts. As a result, the resin solution, etc., can be reliably prevented from reaching the upper face of the light emitting element, which makes it possible to reliably ensure good light extraction efficiency.

Also, since the first bonding ball is formed by wire at the desired location on the metal, it can be disposed at the place where the light reflecting member is most easily made into a thin film. Accordingly, the protrusion of the light reflecting member can be disposed according to the first bonding ball, and this effectively prevents the light reflecting member from becoming a thin film or a film in the form of islands. As a result, the light emitted from the light emitting element will not be absorbed by the metal, so the light extraction efficiency can be improved.

Also, since the first bonding ball and the extension can usually be provided without being inclined at an acute angle to the surface of the metal, unintended upward creeping of the resin solution, etc., can be prevented, and the amount of creep can be easily adjusted, so the light reflecting member can be disposed at only the desired places.

The light reflecting member preferably covers at least part of the side faces of the light emitting element, and more preferably covers the entire side faces. In this case, the whole upper face of the light emitting element is preferably exposed from the light reflecting member. Furthermore, when the substrate has a wall that surrounds the light emitting element, the light reflecting member preferably covers part of the wall, and more preferably covers the entire wall. This allows the light emitted laterally from the light emitting element to be efficiently extracted upward, without lowering the emission efficiency.

The light reflecting member are preferably formed by a reflective material so that its reflectivity of light from the light emitting element will be at least 60%, and preferably at least, 70%, 80%, or 90%.

Examples of the reflective material include, for example, ceramics, resin, dielectrics, pulp, glass, composites of these materials. Among these, a resin is preferable from the standpoint of being able to easily form the desired shape.

Examples of the resin include a thermosetting resin and a thermoplastic resin. Specific Examples of such a resin include resins or hybrid resins which include at least one of a silicone resin; a modified silicone resin, an epoxy resin; a modified epoxy resin; an acrylic resin.

The materials, in particular, the resin is preferably contained a light reflecting material such as titanium dioxide, silicon dioxide, zirconium dioxide, potassium titanate, alumina, aluminum nitride, boron nitride, mullite, niobium oxide, barium sulfate, carbon black, various rare earth oxides (e.g., yttrium oxide, gadolinium oxide, etc.), a light scattering material or a colorant. Further, the materials, in particular, the resin can also contain a fibrous filler such as glass fiber, wollastonite, an inorganic filler such as carbon, a material having a high heat dissipation such as aluminium nitride and the like.

The light reflecting member can usually be formed along with the protrusion by preparing a molten resin or a resin solution by the described above materials, and applying this resin solution, etc., by screen printing, potting, transfer molding, compression molding, or the like. The shape of the protrusion can be easily controlled by adjusting the diameter of the first bonding ball (from more than a dozen microns to a few dozen microns), the compression shape, the concentration (from a few weight percent to a few dozen weight percent), viscosity (from 1 to a few dozen Pa·s), and molding temperature (from a hundred and several tens degrees to a few hundred degrees) of the resin solution, etc., and so forth to within known ranges.

Translucent Member

The translucent member is a member that transmits light emitted from the light emitting element, and preferably is disposed so as to cover the light emitting element and/or the light reflecting member.

The translucent member allows penetration of light, which is 60% or greater of light emitted from the light emitting layer, and further preferably allows penetration of 70% or greater, 80% or greater, or 90% or greater of light emitted from the light emitting layer. Such member can be formed by a material such as a resin, for example, a silicone resin, a modified silicone resin, an epoxy resin, a modified epoxy resin, phenolic resin, polycarbonate resin, acrylic resin, polymethylpentene resin, polynorbornene resin, or hybrid resin containing one or more of these resins, and glass and the like. Of those materials, use of a silicon resin that exhibits good heat resistance and light resistance is preferred.

The translucent member can be in the form of a plate, a sheet, or a block. There are no particular restrictions on its thickness, but about 10 to 1000 μm is preferable. The translucent member can have a uniform thickness, or it can locally be a thick film or a thin film, or its upper face can be a convex face, a concave face, or the like. The planar shape thereof can be suitably adjusted according to the size and shape of the light emitting device, and layout of the light emitting element, and so on, and the size is preferably greater than the upper face of the light emitting element. In particular, the translucent member is preferably large enough to cover the entire upper face of the light emitting element and part of the above-mentioned light reflecting member, and more preferably large enough to cover everything. As discussed above, when a plurality of light emitting elements are covered, the translucent member is preferably large enough to cover the entire upper face of all of these light emitting elements.

The translucent member can comprise a phosphor and/or a diffusion material, etc. These can be contained in the material of the flat translucent member, or a layer containing them can be disposed above, between, or under. Also, the phosphor and/or diffusion material, etc., can be distributed unevenly, such as settling within the translucent member.

The fluorescent material can have a configuration that is known in this technical field, and includes for example, a YAG fluorescent material activated by cerium, LAG fluorescent material activated by cerium, a carcium aluminosilicate containing nitride fluorescent material activated by europium and/or chromiun ($CaO-Al_2O_3-SiO_2$), a silicate fluorescent material activated by europium ($(Sr, Ba)_2SiO_4$), beta sialon fluorescent material, KSF fluorescent material ($K_2SiF_6$:Mn), minute semiconductor particles that are termed quantum dot fluorescent material, and the like. In this manner, it is possible to configure a light emitting device that emits mixed colored light containing a primary light and a secondary light in visible wavelengths (for example, white light), and to configure a light emitting device that is excited by ultraviolet primary light to thereby emit secondary light in visible wavelengths. Using a fluorescent material which exhibits a broad yellow excited by blue light is preferable as a fluorescent material configured to be excited by blue light emitted from the light emitting element to thereby emit white light. For example, YAG fluorescent materials and BOS (Barium ortho-Silicate) fluorescent materials are preferable. When the flat translucent member includes such fluorescent material, the concentration thereof is preferably 5 to 50 weight % with respect to the total weight of the flat translucent member.

Further, it is possible to adjust the color rendering properties and the color reproduction by using the fluorescent materials such as $Si_{6-z}Al_zO_zN_{8-z}$:Eu, $Lu_3Al_5O_{12}$:Ce, $BaMgAl_{10}O_{17}$:Eu, $BaMgAl_{10}O_{17}$:Eu,Mn, (Zn,Cd)Zn:Cu, $(Sr,Ca)_{10}(PO_4)_6Cl_2$:Eu,Mn, $(Sr,Ca)_2Si_5N_8$:Eu, $K_2SiF_6$:Mn and $CaAlSiN_3$:E, etc., in addition to the yellow fluorescent material Examples of the diffusion material include silica, titanium oxide, zirconium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black, a crystalline or sintered body of the fluorescent material, or a sintered body of an inorganic bonding material and the fluorescent material, or the like.

The translucent member can be formed by potting, screen printing, or the like.

In addition to the light emitting element, a protective element, a protective circuit or the like can be installed in the light emitting device of the present invention. There can be just one protective element, or there can be two or more. Examples of the protective element or protective circuit include elements or circuits that protect against overheating, overvoltage, over-current, static electricity, and so forth, and more specifically can be a Zener diode, a transistor diode, or any other such known component.

Embodiments of the light emitting device of the present invention will now be described through reference to the drawings.

Embodiment 1

Figure 1B:
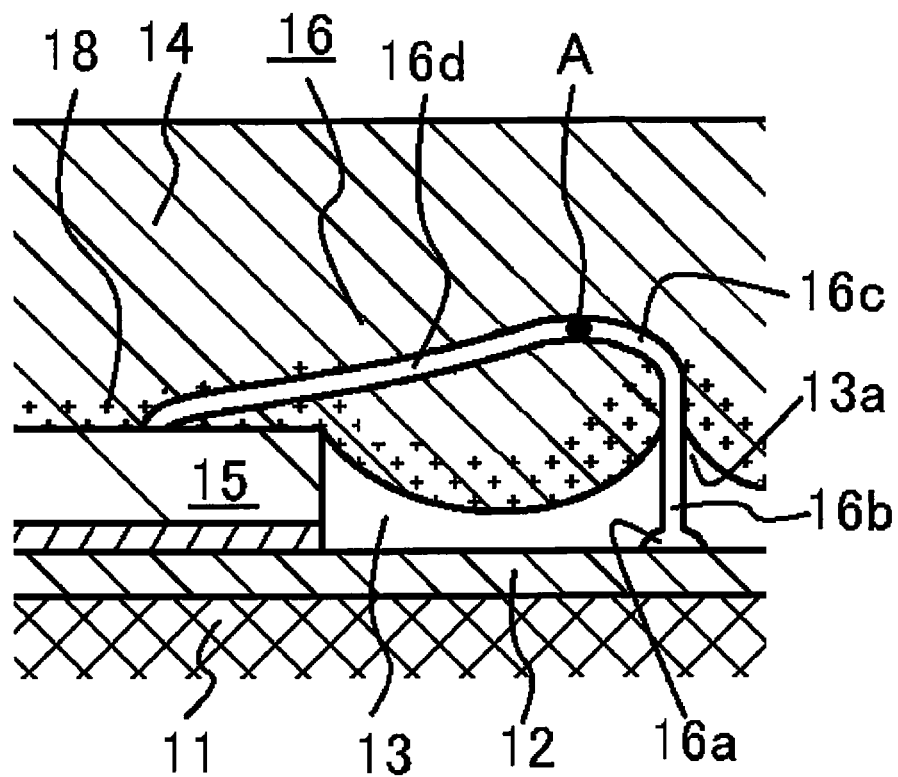
FIG. 1B is a simplified detail view of the main components in FIG. 1A.

As shown in FIGS. 1A and 1B, the light emitting device 10 in this embodiment comprises a substrate 11 having metal 12 on its surface, light emitting elements 15 installed on the surface of the substrate 11, wires 16 that are electrically connected to the light emitting elements 15 and the metal 12, and a light reflecting member 13 that covers the metal 12. It also comprises a translucent member 14 that covers the light emitting elements 15 and the light reflecting member 13.

The substrate 11 has the metal 12, which is formed as a wiring pattern by the vapor deposition of Ti, Pd, and Au on the surface of a flat material composed of an aluminum nitride ceramic, and Au plating is applied over this metal 12. The substrate 11 also has a wall 11a that surrounds the light emitting elements 15. The wall 11a has a step at about the same height as the surface of the light emitting elements 15, and the total height is about three times the thickness of the light emitting element.

The light emitting elements 15 are mounted face-up on the surface of the metal 12 of the substrate 11 by means of a joining member 17 composed of eutectic Au—Sn or another such solder, or an epoxy, silicone, or other such resin.

The light emitting elements 15 have positive and negative electrodes formed on their upper faces, and these positive and negative electrodes are each electrically connected to the metal 12 by the wires 16.

The light emitting elements 15 are formed from a nitride semiconductor ($In_xAl_yGa_{1-X-Y}N$, $0 \leq X$, $0 \leq Y$, $X+Y \leq 1$) as a blue (light with a wavelength of 430 to 490 nm) or green (light with a wavelength of 490 to 570 nm) light emitting element.

The wires 16 are gold wires with a diameter of 15 μm, and each have a first bonding ball 16a and an extension 16b that extends upward from the first bonding ball 16a, that is, substantially perpendicular to the surface of the metal 12. The wires 16 also each have a part 16c in which the direction changes from the extension 16b toward the light emitting element 15, and a part 16d that extends at a slight downward angle from the part 16c to the light emitting element 15 and is electrically connected to the light emitting element 15, and the wires 16 are connected in a state of being pressed against the upper faces of the electrodes of the light emitting elements 15. This series of wires 16 is such that the highest part A is disposed above the metal 12 where the light emitting elements 15 are not installed, between the light emitting elements 15 and the first bonding balls 16a.

The height of the first bonding balls 16a is about 20 μm, and the diameter of the part in contact with the metal 12 is about 60 to 120 μm. The highest part A of the wires is about 160 to 180 μm from the surface of the metal 12. The extensions 16b go to a height of about 160 μm from the surface of the metal.

The light reflecting member 13 contains about 30 wt % titanium oxide in a silicone resin.

The light reflecting member 13 covers the entire metal 12 on the substrate 11, and has a protrusion 13a (resulting from surface tension) that reaches to over the first bonding ball 16a.

The protrusion 13a covers the entire exposed surface of the first bonding ball 16a, and also covers part of the area under the extension 16b and over the first bonding ball 16a.

The height of the protrusion 13a is adjusted by means of the viscosity, etc., of the resin solution, etc., when the light reflecting member 13 is formed, and steadily increases toward the first bonding ball 16a. The highest (thickest) part of the protrusion 13a is a height (thickness) of about 100 μm from the surface of the metal 12. The thickness at the thinnest part of the light reflecting member 13 is about 10 μm.

Also, because of its surface tension, the light reflecting member 13 covers the entire side faces of the light emitting elements 15 and the entire wall 11a of the stepped substrate 11.

The translucent member 14 is disposed covering the light emitting elements 15 and the light reflecting member 13. The upper face of the translucent member 14 lies in substantially the same plane as the upper face of the wall 11a.

The translucent member 14 contains 5 to 10 wt % (of the total amount of the translucent member 14) YAG as a phosphor in a silicone resin. The phosphor 18 settles within the silicone resin, and is deposited on the light reflecting member 13 side.

As discussed above, with the light emitting device in this embodiment, wires consisting of first bonding balls and extensions that extend upward from these first bonding balls are actively disposed on the metal, which allows the resin solution constituting the light reflecting member, which is expected to creep up to unintended parts, to actively creep up the first bonding balls. Therefore, creep of the resin solution to unintended parts (namely, the upper faces of the light emitting elements) can be reliably prevented. As a result, good light extraction efficiency can be ensured.

From another standpoint, the fact that the light reflecting member has the protrusion allows the metal surface of the light reflecting member to be reliably covered. Also, the covering of the light emitting element upper faces by the light reflecting member can be effectively prevented. Thus, the light extraction efficiency can be improved, and the need for initial brightness can be fully satisfied.

Consequently, there is no need for fine tuning of the minute amount of resin solution, etc., used in a single light emitting device, which can be extremely difficult, and the above-mentioned effect can be obtained reliably by a simple method involving the adjustment of the viscosity of the resin solution, etc.

Also, since the first bonding balls are formed at the desired positions on the metal, they can be disposed at places where the light reflecting member is most likely to become a thin film. Accordingly, the protrusions of the light reflecting member can be disposed by means of the first bonding balls, and this effectively prevents the light reflecting member from becoming a thin film or a film in the form of islands. As a result, the metal will not absorb the light emitted from the light emitting elements, and the light extraction efficiency can be improved.

Furthermore, since the first bonding balls and extensions can usually be disposed without being inclined at an acute angle to the surface of the metal, this prevents the unintended creeping up of the resin solution, etc., and since the amount of this creep can be easily adjusted, the light reflecting member can be disposed in only the desired locations.

Embodiment 2

Figure 2:
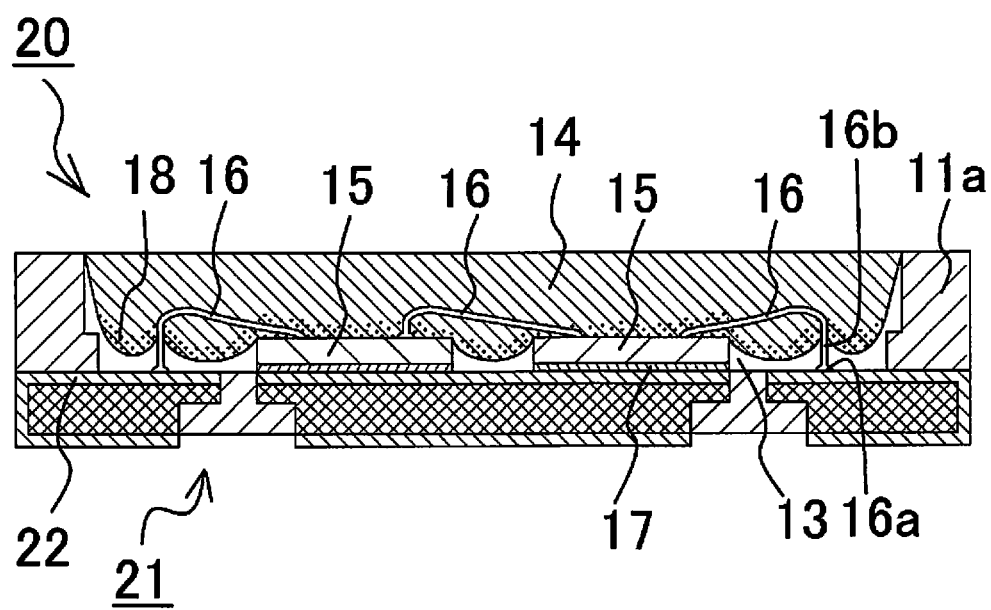
FIG. 2 is a simplified cross section of the main components of another embodiment of the light emitting device of the present invention.

As shown in FIG. 2, the light emitting device 20 in this embodiment is configured substantially the same as the light emitting device 10 in Embodiment 1, except that there are two light emitting elements 15 connected in series, and a corresponding substrate 21 and metal 22 pattern is used. In this case, a ball stitch on ball is formed on the electrode of one of the light emitting elements 15 in order to connect the light emitting elements 15 together.

The light emitting device in this embodiment has the same effect as that in Embodiment 1.

INDUSTRIAL APPLICABILITY

A light emitting device having a light emitting element according to the present disclosure can be suitably employed for various lighting apparatuses, in particular, a light source for lighting, an LED display, backlight source for a cell phone, signals, a lighted switch, car-mounted stop lump, various sensors, various indicators in addition to lighting apparatuses using image reading system of fax machine, copying machine or hand scanner, with high reliability. Further, wire bonding for various light emitting devices such as ICs, memories can be widely-applied.

It is to be understood that although the present invention has been described with regard to preferred embodiments thereof, various other embodiments and variants can occur to those skilled in the art, which are within the scope and spirit of the invention, and such other embodiments and variants are intended to be covered by the following claims.

What is claimed is:

1. A light emitting device, comprising:
   a substrate having a metal on a surface thereof;
   a light emitting element installed on the surface of the substrate;
   a wire connecting the light emitting element and the metal; and
   a light reflecting member covering the metal,
   the wire having a first bonding ball that is disposed on a surface of the metal, and an extension that extends above the first bonding ball, and
   the light reflecting member having a shape that creeps up toward the extension to define a protrusion over the first bonding ball.

2. The light emitting device according to claim 1, wherein the extension extends in the vertical direction with respect to the surface of the metal.

3. The light emitting device according to claim 1, wherein the light reflecting member covers at least part of a side face of the light emitting element.

4. The light emitting device according to claim 1, wherein the light reflecting member gradually changes the height toward the protrusion.

5. The light emitting device according to claim 1, wherein the substrate has a wall that surrounds the light emitting element, and the light reflecting member covers at least part of the wall.

6. The light emitting device according to claim 1, further including
   a translucent member being disposed so as to cover at least the light emitting element or the light reflecting member.

7. The light emitting device according to claim 6, wherein the translucent member includes a fluorescent material.

8. The light emitting device according to claim 1, wherein the light emitting element is face-up-mounted on the surface of the substrate, and the wire electrically connects an electrode constituting the light emitting element with the metal.

9. The light emitting device according to claim 1, wherein the light reflecting member covers an entire side faces of the light emitting element, and exposes a whole upper face of the light emitting element therefrom.

10. The light emitting device according to claim 1, wherein the wire being such that a highest part is disposed between the light emitting element and the first bonding ball, and above the metal where the light emitting elements are not installed.

11. The light emitting device according to claim 1, wherein the wire being such that a highest part is disposed at a position closer to the first bonding ball than to the light emitting element.

12. The light emitting device according to claim 1, wherein the light reflecting member having the shape that peaks at the extension.

* * * * *